US010689512B2

(12) United States Patent
Liu et al.

(10) Patent No.: US 10,689,512 B2
(45) Date of Patent: Jun. 23, 2020

(54) RESIN COMPOSITION, AND PREPREG, METAL-CLAD LAMINATE, AND PRINTED CIRCUIT BOARD USING THE SAME

(71) Applicant: TAIWAN UNION TECHNOLOGY CORPORATION, Chupei, Hsinchu County (TW)

(72) Inventors: Shur-Fen Liu, Chupei (TW); Meng-Huei Chen, Chupei (TW)

(73) Assignee: TAIWAN UNION TECHNOLOGY CORPORATION, Chupei, Hsinchu (TW)

( * ) Notice: Subject to any disclaimer, the term of this patent is extended or adjusted under 35 U.S.C. 154(b) by 57 days.

(21) Appl. No.: 15/496,334

(22) Filed: Apr. 25, 2017

(65) Prior Publication Data
US 2018/0208765 A1    Jul. 26, 2018

(30) Foreign Application Priority Data
Jan. 20, 2017   (TW) ............................. 106102088 A

(51) Int. Cl.
| | |
|---|---|
| *C08L 71/12* | (2006.01) |
| *C08J 5/24* | (2006.01) |
| *C09D 171/12* | (2006.01) |
| *H05K 1/03* | (2006.01) |
| *H05K 3/00* | (2006.01) |

(52) U.S. Cl.
CPC ............... *C08L 71/126* (2013.01); *C08J 5/24* (2013.01); *H05K 1/0353* (2013.01); *H05K 1/0373* (2013.01); *C08J 2371/12* (2013.01); *C08J 2409/06* (2013.01); *C08J 2463/00* (2013.01); *C08J 2475/16* (2013.01); *C08J 2479/08* (2013.01); *C08L 2201/02* (2013.01); *C08L 2203/20* (2013.01); *C08L 2205/02* (2013.01); *C08L 2205/035* (2013.01); *H05K 3/0011* (2013.01); *H05K 2201/012* (2013.01); *H05K 2201/0209* (2013.01)

(58) Field of Classification Search
CPC ... C09D 171/12; C08L 71/123; C08L 71/126; C08L 2201/02; C08L 2203/20; C08L 2205/02; C08L 2205/035; C08J 5/24; C08J 2371/12; C08J 2409/06; C08J 2463/00; C08J 2475/16; C08J 2479/08; H05K 1/0373; H05K 3/0011; H05K 2201/012; H05K 2201/0129

See application file for complete search history.

(56) References Cited

U.S. PATENT DOCUMENTS

| | | |
|---|---|---|
| 2005/0042466 A1 | 2/2005 | Ohno et al. |
| 2005/0064159 A1 | 3/2005 | Amou et al. |
| 2014/0275377 A1† | 9/2014 | Yin |
| 2016/0021740 A1† | 1/2016 | Li |
| 2016/0148719 A1* | 5/2016 | Yin ......................... C08L 71/12 524/119 |
| 2016/0160008 A1* | 6/2016 | Wang ................... C08K 5/5397 524/710 |
| 2016/0280913 A1 | 9/2016 | Liu et al. |
| 2018/0170005 A1† | 6/2018 | Saito |

FOREIGN PATENT DOCUMENTS

| | | |
|---|---|---|
| TW | 200514805 A | 5/2005 |
| TW | 200519158 A | 6/2005 |
| TW | 201428055 A | 7/2014 |
| TW | 201602321 A | 1/2016 |
| TW | 201634580 A | 10/2016 |
| WO | 2017002319 A1 | 1/2017 |

OTHER PUBLICATIONS

U.S. Appl. No. 15/298,568, Shur-Fen Liu et al.

\* cited by examiner
† cited by third party

*Primary Examiner* — Bijan Ahvazi
(74) *Attorney, Agent, or Firm* — Michael Ferrell; Ferrells, PLLC; Anna Kinney

(57) ABSTRACT

A resin composition is provided. The resin composition comprises the following:

(a) a resin system, which comprises a thermosetting resin constituent and a vinyl-containing elastomer and has a dissipation factor (Df) of not higher than 0.008 at 10 GHz after curing; and (b) a phosphorous-containing flame retardant, which is a compound of formula (I), a compound of formula (II), or a combination thereof:

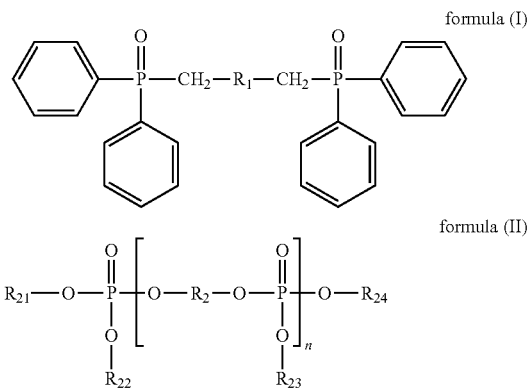

wherein $R_1$, $R_2$, $R_{21}$, $R_{22}$, $R_{23}$, $R_{24}$, and n are as defined in the specification.

21 Claims, No Drawings

RESIN COMPOSITION, AND PREPREG, METAL-CLAD LAMINATE, AND PRINTED CIRCUIT BOARD USING THE SAME

CLAIM FOR PRIORITY

This application claims the benefit of Taiwan Patent Application No. 106102088 filed on Jan. 20, 2017, the subject matters of which are incorporated herein in their entirety by reference.

BACKGROUND OF THE INVENTION

Field of the Invention

The present invention relates to a resin composition, especially a halogen-free flame-retardant resin composition that includes a phosphorous-containing flame retardant, and uses of the resin composition. The resin composition of the present invention can be used in combination with glass fibers to constitute a composite material or prepreg, and furthermore can be used as a metal foil adhesive to manufacture a metal-clad laminate and printed circuit board. The resin composition of the present invention is particularly suitable for use in high frequency applications.

Descriptions of the Related Art

The requirements on the physicochemical properties of electronic materials become strict these days because the electronic materials have entered high frequency applications. The conventional electronic materials are failing to keep up with the trends of high-frequency and high-speed signal transmission, miniaturization of electronic elements, and high-density wiring of PCBs. In addition, environmentally unfriendly halogen-containing flame retardants will be gradually replaced by halogen-free flame retardants, such as metal hydroxides or nitrogen- or phosphorous-containing compounds, due to increased environmental awareness.

However, most halogen-free flame retardants will deteriorate the electrical properties or other physical properties of the applied electronic material. For example, the dielectric constant (Dk) or the dissipation factor (Df) of the electronic material may be increased, or the peeling strength or thermal stability of the electronic material may be deteriorated. Therefore, there is a need for a halogen-free electronic material which is suitable for use in high frequency application and has a low Dk and Df value as well as good peeling strength and thermal stability.

SUMMARY OF THE INVENTION

As described in the following objectives of the present invention, the present invention provides a resin composition suitable for use in high frequency applications. The resin composition can provide an electronic material which is particularly suitable for use in high frequency applications and has good dielectric properties and physicochemical properties (e.g., high glass transition temperature, high peeling strength, and good flame retardance).

An objective of the present invention is to provide a resin composition, which comprises the following:
(a) a resin system, which comprises a thermosetting resin constituent and a vinyl-containing elastomer and has a dissipation factor (Df) of not higher than 0.008 at 10 GHz after curing; and
(b) a phosphorous-containing flame retardant, which is a compound of formula (I), a compound of formula (II), or a combination thereof:

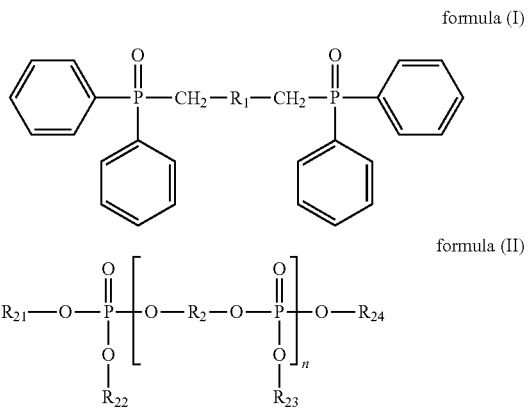

formula (I)

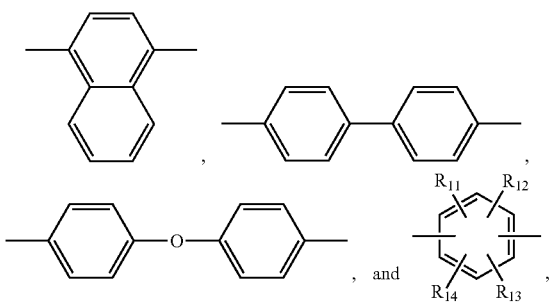

formula (II)

wherein,
$R_1$ is selected from the group consisting of a covalent bond, —$CH_2$—,

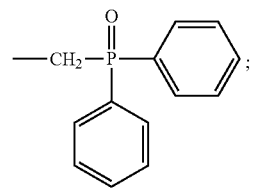 [SMILES: CCP(=O)(c1ccccc1)c1ccccc1]

, and wherein $R_{11}$, $R_{12}$, $R_{13}$, and $R_{14}$ are independently H, alkyl, or

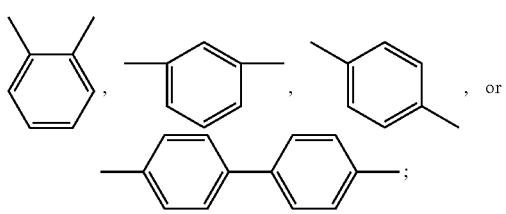

$R_2$ is

, , , or

;

$R_{21}$, $R_{22}$, $R_{23}$, and $R_{24}$ are independently an aryl or an alkylaryl; and
n is 1 or 2.

Another objective of the present invention is to provide a prepreg, which is prepared by immersing a substrate into the resin composition described above or is prepared by coating the resin composition described above onto a substrate and drying the coated substrate.

Yet another objective of the present invention is to provide a metal-clad laminate, which is prepared from the prepreg described above or is prepared by directly coating the resin composition described above onto a metal foil and drying the coated metal foil.

Yet another objective of the present invention is to provide a printed circuit board, which is prepared from the metal-clad laminate described above.

To render the above objectives, the technical features and advantages of the present invention more apparent, the present invention will be described in detail with reference to some embodiments hereinafter.

BRIEF DESCRIPTION OF THE DRAWINGS

Not applicable.

DESCRIPTION OF THE PREFERRED EMBODIMENT

Hereinafter, some embodiments of the present invention will be described in detail. However, without departing from the spirit of the present invention, the present invention may be embodied in various embodiments and should not be limited to the embodiments described in the specification. Furthermore, for clarity, the size of each element and each area may be exaggerated in the appended drawings and not depicted in actual proportion. Unless it is additionally explained, the expressions "a," "the," or the like recited in the specification (especially in the claims) should include both the singular and the plural forms. Furthermore, unless it is additionally explained, while describing the constituents in the solution, mixture and composition in the specification, the amount of each constituent is calculated based on the dry weight, i.e., regardless of the weight of the solvent.

The technical problem to be solved by the present invention is that the electronic materials prepared by using conventional resin compositions are not sufficient to meet the requirements of high frequency applications. To solve the aforementioned problem, the present invention applies the following technical means: using a specific phosphorous-containing compound or a combination of specific phosphorous-containing compounds in combination with a specific thermosetting resin constituent and an elastomer. The resin composition of the present invention after curing can provide an electrical material with good electrical properties and physicochemical properties. The resin composition of the present invention also meets the requirement of providing flame retardance properties in a halogen-free way. Therefore, the resin composition of the present invention is particularly suitable for providing a new electrical material which is useful in high frequency applications.

Resin Composition

The resin composition of the present invention comprises a resin system (a) and a phosphorous-containing flame retardant (b). The detailed descriptions for each constituents of the resin composition are provided below.

[Resin System (a)]

In the resin composition of the present invention, the resin system (a) comprises a thermosetting resin constituent and a vinyl-containing elastomer, and has a dissipation factor (Df) of not higher than 0.008 at 10 GHz after curing. As used herein, the thermosetting resin refers to a resin that can be gradually cured by forming a network structure through a cross-linking reaction under heating. The abovementioned curing reaction is an irreversible reaction; that is, the cured resin cannot be melted or softened again. In the resin system (a), the thermosetting resin constituent can be provided by using a single thermosetting resin or by using multiple several thermosetting resins. However, in either case, the prepared resin system (a) should meet the condition that the dielectric loss (Df) thereof is not higher than 0.008 at 10 GHz, so that the cured product of the resin composition can be provided with good electrical properties.

Examples of the thermosetting resin include but are not limited to polyphenylene ether (PPE) resins containing unsaturated group(s), epoxy resins, phenolic resins, isocyanurates containing vinyl or allyl group, cyanate resins, polyamide resins, polyimide resins, polyether resins, polycarbonate resins, bismaleimide (BMI) resins, and combinations thereof.

In some embodiments of the present invention, the thermosetting resin constituent of the resin system (a) comprises a thermosetting resin selected from the group consisting of polyphenylene ether resins containing unsaturated group(s), isocyanurates containing vinyl or allyl group, bismaleimide resins, epoxy resins, and combinations thereof. In terms of electrical properties, the thermosetting resin constituent of the resin system (a) preferably comprises a thermosetting resin selected from the group consisting of polyphenylene ether resins containing unsaturated group(s), isocyanurates containing vinyl or allyl group, bismaleimide resins, and combinations thereof.

<Polyphenylene Ether Resin Containing Unsaturated Group(s)>

As used herein, a polyphenylene ether resin containing unsaturated group(s) means that the polymer main chain of the resin is polyphenylene ether and the resin has unsaturated functional group(s) such as vinyl or allyl group. Examples of the polyphenylene ether resin containing unsaturated group(s) include but are not limited to vinyl polyphenylene ether resins, allyl polyphenylene ether resins, acrylate polyphenylene ether resins, and methacrylate polyphenylene ether resins. Each of the polyphenylene ether resins containing unsaturated group(s) can either be used alone or in combination. For example, the polyphenylene ether resin containing unsaturated group(s) may have the structure of the following formula (III):

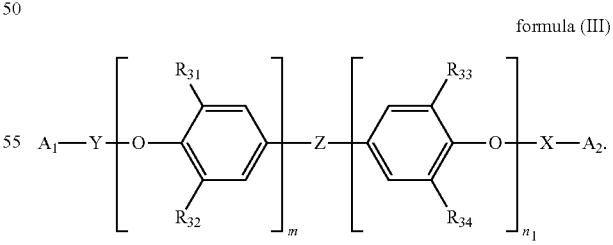

formula (III)

In formula (III), $R_{31}$, $R_{32}$, $R_{33}$, $R_{34}$ are independently H or a substituted or unsubstituted $C_1$-$C_5$ alkyl, such as methyl, ethyl, n-propyl, isopropyl and n-butyl, and preferably methyl (—$CH_3$);

m and $n_1$ are independently an integer ranging from 0 to 100, with the proviso that m and $n_1$ are not 0 at the same time;

$A_1$ and $A_2$ are independently selected from the group consisting of

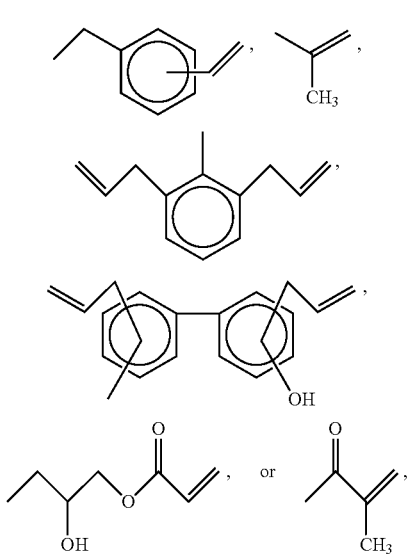

and preferably

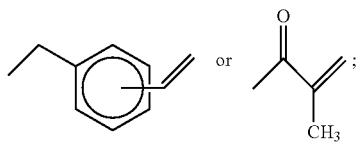

X and Y are independently a carbonyl group, an alkenyl-containing group or absent. It is preferred that X and Y are both absent or X has the structure of the following formula (III-1) and Y has the structure of the following formula (III-2):

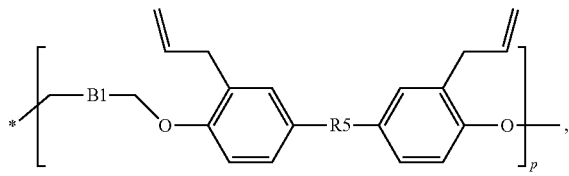
formula (III-1)

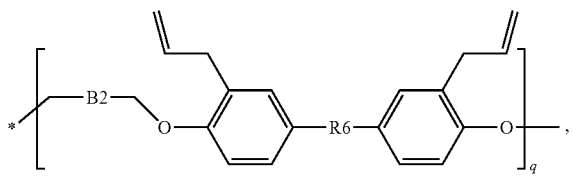
formula (III-2)

in the formulas (III-1) and (III-2),

* indicates the end connecting oxygen (—O—) of formula (III);

B1 and B2 are independently

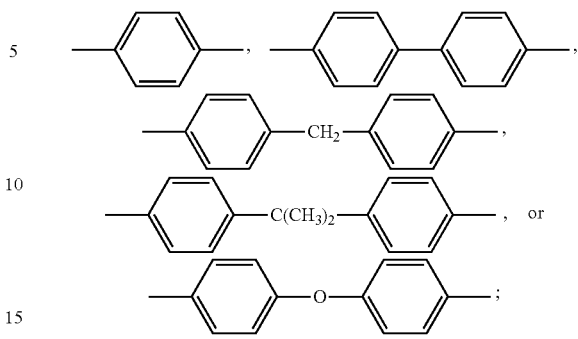

R5 and R6 are independently —O—, —$SO_2$—, or —C($CH_3$)$_2$—, or absent; and p and q are independently an integer, and $1 \leq p+q < 20$, preferably $1 \leq p+q < 10$, and more preferably $1 \leq p+q < 3$; and Z is —O—,

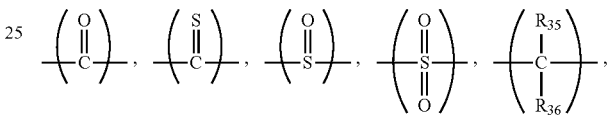

or absent, wherein $R_{35}$ and $R_{36}$ are independently H or a $C_1$-$C_{12}$ alkyl, and preferably

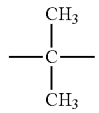

or absent. Other examples of the polyphenylene ether resin containing unsaturated group(s) include those recited in US 2016/0280913 A1 (Applicant: Taiwan Union Technology Corporation) and U.S. patent application Ser. No. 15/298,568 (Applicant: Taiwan Union Technology Corporation). The subject matters of the aforementioned US applications are incorporated herein in their entirety by reference. Examples of commercially available polyphenylene ether resin containing unsaturated group(s) include but are not limited thereto the products available from Mitsubishi Gas Chemical Company (trade names: OPE-2St and OPE-2EA), Sabic Company (trade name: SA9000), and Jin-Yi Chemical (trade name: PP807).

The weight average molecular weight (Mw) of the polyphenylene ether resin containing unsaturated group(s) is generally 1,000 to 80,000, preferably 1,000 to 50,000, and more preferably 1,000 to 10,000. If the weight average molecular weight of the polyphenylene ether resin containing unsaturated group(s) is higher than the designated range, the polyphenylene ether resin has poor flowability and solubility. If the weight average molecular weight of the polyphenylene ether resin containing unsaturated group(s) is lower than the designated range, the electronic material prepared therefrom has poor electrical properties and thermal stability.

<Isocyanurate Containing Vinyl or Allyl Group>

As used herein, an isocyanurate containing vinyl or allyl group refers to a cyanurate containing unsaturated double bond functional group(s) or an isocyanurate containing unsaturated double bond functional group(s). The isocyanurate containing vinyl or allyl group is usually a reactive monomeric compound which can react with the unsaturated group(s) of, for example, the polyphenylene ether resin containing unsaturated group(s) to provide a cross-linking effect. Examples of the isocyanurate containing vinyl or allyl group include but are not limited to triallyl isocyanurate (TAIC), triallyl cyanurate (TAC), or a combination thereof. In some embodiments of the present invention, triallyl isocyanurate (TAIC) is used.

<Bismaleimide Resin>

As used herein, a bismaleimide resin refers to a compound with at least two maleimide functional groups. The maleimide functional group has a reactive double bond and can react with other functional groups in the resin composition to provide a cross-linking effect. The maleimide functional group can also improve the thermal resistance of the cured product of the resin composition. For example, the bismaleimide resin can be a bismaleimide resin of formula (IV), a bismaleimide resin of formula (V), or a combination thereof.

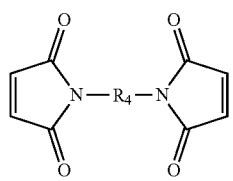

formula (IV)

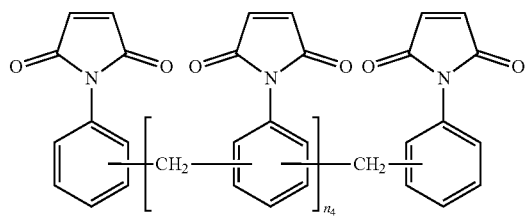

formula (V)

In formulas (IV) and (V), R$_4$ is an organic group, and preferably methylene (—CH$_2$—), 4,4'-diphenylmethane

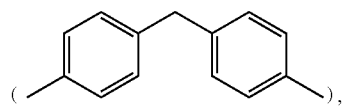

m-phenylene

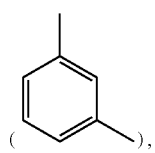

bisphenol A diphenyl ether

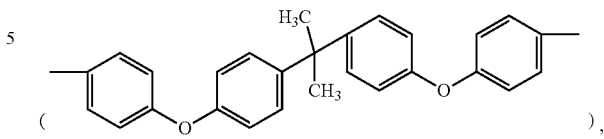

3,3'-dimethyl-5,5'-diethyl-4,4'-diphenyl methane

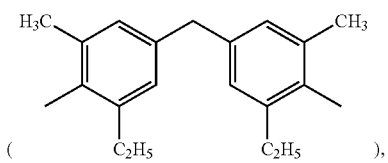

4-methyl-1,3-phenylene

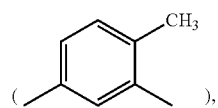

or (2,2,4-trimethyl)hexane

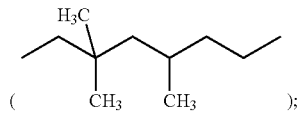

and n$_4$ is an integer ranging from 1 to 100.

Examples of the bismaleimide resin include but are not limited to 1,2-bismaleimidoethane, 1,6-bismaleimidohexane, 1,3-bismaleimidobenzene, 1,4-bismaleimidobenzene, 2,4-bismaleimidotoluene, 4,4'-bismaleimidodiphenylmethane, 4,4'-bismaleimidodiphenylether, 3,3'-bismaleimidodiphenylsulfone, 4,4'-bismaleimidodiphenylsulfone, 4,4'-bismaleimidodicyclohexylmethane, 3,5-bis(4-maleimidophenyl)pyridine, 2,6-bismaleimidopyridine, 1,3-bis(maleimidomethyl)cyclohexane, 1,3-bis(maleimidomethyl)benzene, 1,1-bis(4-maleimidophenyl)cyclohexane, 1,3-bis(dichloromaleimido)benzene, 4,4'-biscitraconimidodiphenylmethane, 2,2-bis(4-maleimidophenyl)propane, 1-phenyl-1,1-bis(4-maleimidophenyl)ethane, α,α-bis(4-maleimidophenyl)toluene, 3,5-bismaleimido-1,2,4-triazole, N,N'-ethylenebismaleimide, N,N'-hexamethylenebismaleimide, N,N'-m-phenylenebismaleimide, N,N'-p-phenylenebismaleimide, N,N'-4,4'-diphenylmethanebismaleimide, N,N'-4,4'-diphenyletherbismaleimide, N,N'-4,4'-diphenylsufonebismaleimide, N,N'-4,4'-dicyclohexylmethanebismaleimide, N,N'-α,α'-4,4'-dimethylenecyclohexane bismaleimide, N,N'-m-xylenebismaleimide, N,N'-4,4'-diphenylcyclohexanebismaleimide, and N,N'-methylenebis(3-chloro-p-phenylene) bismaleimide. In some embodiments of the present invention, 4,4'-diphenylmethanebismaleimide

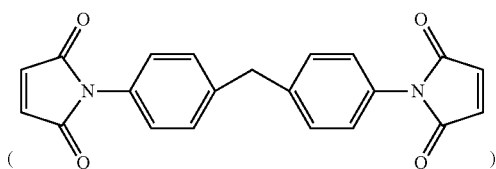 [SMILES: O=C1C=CC(=O)N1c1ccc(Cc2ccc(N3C(=O)C=CC3=O)cc2)cc1]

is used as the bismaleimide resin.

<Epoxy Resin>

As used herein, an epoxy resin refers to a thermosetting resin with at least two epoxy functional groups in a molecule, such as a multi-functional epoxy resin, linear phenolic epoxy resin, or a combination thereof. Examples of the abovementioned multi-functional epoxy resin include bifunctional epoxy resins, tetrafunctional epoxy resins, and octofunctional epoxy resin. Specific examples of the epoxy resin include but are not limited to bisphenol A epoxy resins, bisphenol F epoxy resins, bisphenol S epoxy resins, phenol phenolic epoxy resins, cresol phenolic epoxy resins, bisphenol A phenolic epoxy resins, bisphenol F phenolic epoxy resins, diphenylethylene epoxy resins, triazine skeleton-containing epoxy resins, fluorene skeleton-containing epoxy resins, triphenol bisphenol A epoxy resins, biphenyl epoxy resins, xylylene epoxy resins, biphenyl aralkyl epoxy resins, naphthalene epoxy resins, dicyclopentadiene (DCPD) epoxy resins, and alicyclic epoxy resins. Examples of the epoxy resin also include diglycidyl ether compounds of multi-ring aromatics such as multi-functional phenols and anthracenes. Furthermore, phosphorous may be introduced into the epoxy resin to provide a phosphorous-containing epoxy resin. In some embodiments of the present invention, bisphenol A epoxy resins and DCPD epoxy resins are used.

The abovementioned epoxy resins can either be used alone or in combination depending on the need of persons with ordinary skill in the art. To meet halogen-free requirements while conforming to the desired electrical properties of the final product, it is preferred that a halogen-free epoxy resin with a dissipation factor (Df) of not higher than 0.008 at 10 GHz after curing is used.

Based on the dry weight of the resin composition, the amount of the thermosetting resin constituent is 20 wt % to 95 wt %, preferably 30 wt % to 80 wt %, such as 35 wt %, 40 wt %, 45 wt %, 50 wt %, 60 wt % and 70 wt %. If the amount of the thermosetting resin constituent is lower than the designated range, the electronic material prepared by using the resin composition cannot provide the desired low Dk value and low Df value. If the amount of the thermosetting resin constituent is higher than the designated range, the properties of the other constituents of the resin composition cannot be revealed sufficiently. As a result, the physicochemical properties of the electronic material prepared by using the resin composition, such as the flame retardance and thermal resistance, are poor.

In addition to the aforementioned thermosetting resins, the thermosetting resin constituent of the resin system (a) may optionally comprise other conventional thermosetting resins, such as phenolic resins and styrene maleic anhydride (SMA) resins, with the proviso that the designated condition of dielectric loss (Df) (i.e., the resin system has a Df of not higher than 0.008 at 10 GHz after curing) is not violated. The conventional thermosetting resins may have reactive functional group(s). The "reactive functional group" in the context can be any group capable of conducting a curing reaction. Examples of the reactive functional group include but are not limited to hydroxyl groups, carboxyl groups, alkenyl groups, and amino groups.

<Vinyl-Containing Elastomer>

As used herein, a vinyl-containing elastomer refers to an olefin polymer with unsaturated functional group(s). The vinyl-containing elastomer can be used as a cross-linking hardener and can react with functional group(s) of the thermosetting resin via double bond. The vinyl-containing elastomer not only effectively improves the thermal resistance of the resin composition after curing, but also imparts good physical properties (e.g., toughness and drill processability) to the resin composition after curing through its own toughening property. Examples of the vinyl-containing elastomer include but are not limited to butadiene polymers, butadiene/styrene copolymers, butadiene/isoprene copolymers, isoprene polymers, and isoprene/styrene copolymers. The vinyl-containing elastomer preferably has a 1,2-addition polybutadiene with unsaturated double bond (i.e., butadienyl) in the molecule structure. In terms of the physical properties of the resin composition, the vinyl content of the 1,2-addition polybutadiene with unsaturated double bond in the molecule structure of the vinyl-containing elastomer is preferably higher than 20 wt %, more preferably, higher than 50 wt %, based on the total weight of the vinyl-containing elastomer. If the vinyl content of the 1,2-addition polybutadiene with unsaturated double bond in the molecule structure is less than 20 wt %, the vinyl-containing elastomer cannot sufficiently cross-link with the thermosetting resin; that is, the cross-linking density is insufficient, and a poor thermal resistance resulted.

Examples of the vinyl-containing elastomer include but are not limited to elastomers selected from the group consisting of polybutadienes, styrene butadiene copolymers (SBR), styrene butadiene styrene block copolymers (SBS), polyisoprenes, styrene isoprene copolymers, styrene isoprene styrene block copolymers (SIS), acrylonitrile butadiene copolymers, acrylonitrile butadiene styrene block copolymers, and combinations thereof. In some embodiments of the present invention, a styrene butadiene copolymer (SBR) is used. Examples of commercially available elastomers include but are not limited to Ricon 100, Ricon 181, Ricon 184, Ricon 104H, Ricon 250, Ricon 257, Ricon 157, Ricon 130, and Ricon 130MA products available from CRAY VALLEY Company.

Based on the dry weight of the resin composition, the amount of the vinyl-containing elastomers is 2 wt % to 20 wt %, preferably 5 wt % to 15 wt %, such as 6 wt %, 7 wt %, 8 wt %, 10 wt %, 12 wt %, or 14 wt %. If the amount of the vinyl-containing elastomer is lower than the designated range, the electronic material prepared therefrom does not have the required electrical properties and physical properties (i.e., low Dk, low Df, and good toughness). If the amount of the vinyl-containing elastomer is higher than the designated range, the properties of the other constituents of the resin composition cannot be revealed sufficiently, and the result is, for example, the flame retardance or thermal resistance of the electronic material prepared therefrom is poor.

[Phosphorous-Containing Flame Retardant (b)]

In the resin composition of the present invention, the phosphorous-containing flame retardant (b) is a compound which contains phosphorous and can impart flame retardance to the resin composition. Specifically, the phosphorous-containing flame retardant (b) is a compound of formula (I), a compound of formula (II), or a combination thereof.

formula (I)

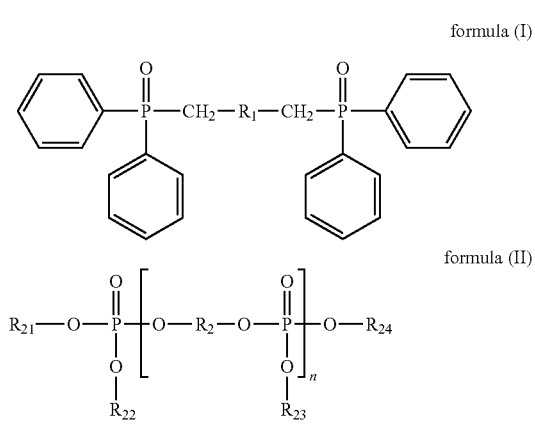

formula (II)

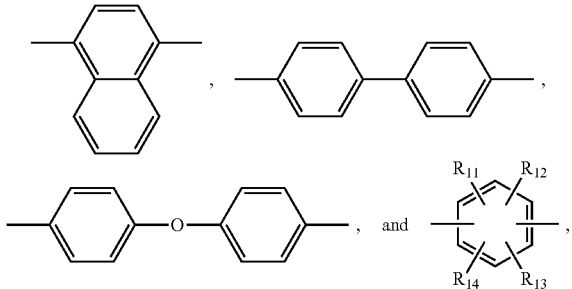

In formulas (I) and (II), $R_1$ is selected from the group consisting of a covalent bond, —$CH_2$—,

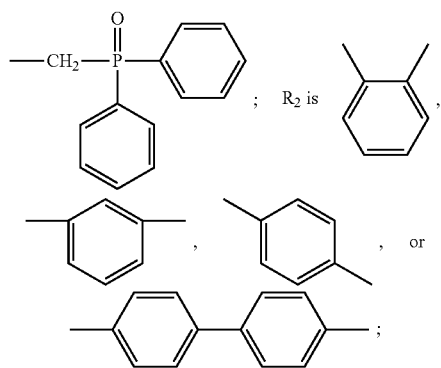

wherein $R_{11}$, $R_{12}$, $R_{13}$, and $R_{14}$ are independently H, alkyl, or $R_{21}$, $R_{22}$, $R_{23}$, and $R_{24}$ are independently an aryl or an alkylaryl; and n is 1 or 2.

The compound of formula (I) is a phosphine oxide, which can be obtained by the condensation reaction of a diphenylphosphine oxide and a chloroalkyl aromatic compound. Examples of the chloroalkyl aromatic compound include but are not limited to 1,4-bis(chloromethyl) benzene, 1,3-bis(chloromethyl) benzene, 1,2-bis(chloromethyl) benzene, 4,4'-bis(chloromethyl)-1,1'-biphenyl, 4,4'-bis(chloromethyl)-1,1'-phenyl ether, chloromethyl benzene, 1-chloromethyl benzene, 2-chloromethyl benzene, and 1,4-bis(chloromethyl) naphthalene. The PQ-60 product available from Jin-Yi Chemical is an example of the compound of formula (I).

The compound of formula (II) is a diphosphate. Examples of the compound of formula (II) include resorcinol bis-xylenylphosphate (RXP;

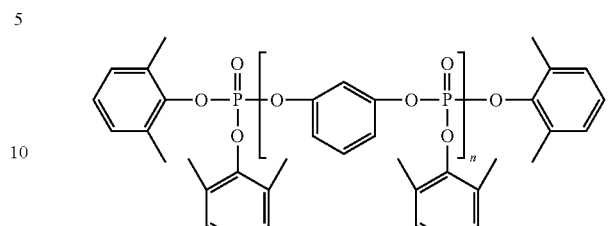
)

and resorcinol bis-diphenylphosphate (RDP;

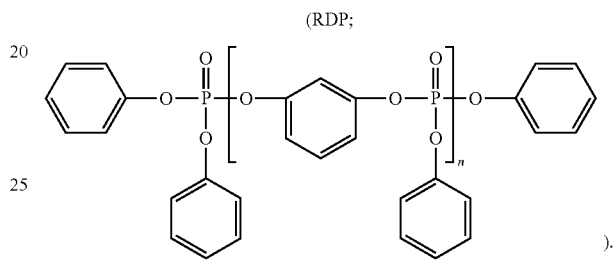
).

Examples of the commercially available diphosphates include CG-686 and CG-RDP products available from Chembridge International Corporation and PX-200 products available from Otsuka Chemical.

It has been found that the phosphine oxide of formula (I) and diphosphate of formula (II) can provide, in addition to their well-known flame retardance, excellent electrical properties for the resin composition, so that the halogen-free electronic material prepared from the resin composition is particularly suitable for use in high frequency applications. Furthermore, when the phosphine oxide of formula (I) are used in combination with the diphosphate of formula (II) in the resin composition, the cured product of the resin composition can have not only good electrical properties but also outstanding thermal resistance (e.g., high Tg) and peeling strength. Therefore, in the preferred embodiments of the present invention, the phosphorous-containing flame retardant (b) is a combination of the compound of formula (I) and the compound of formula (II), and the weight ratio of the compound of formula (I) to the compound of formula (II) is 1:2 to 2:1, preferably 1:1.

Based on the dry weight of the resin composition, the amount of the phosphorous-containing flame retardant (b) is preferably 2 wt % to 22 wt %, more preferably 5 wt % to 15 wt %, such as 6 wt %, 7 wt %, 8 wt %, 10 wt %, 12 wt %, or 14 wt %. If the amount of the phosphorous-containing flame retardant (b) is lower than the preferred range, the flame retardance of the electronic material prepared by using the resin composition is poor (e.g., failing to comply with UL 94 V0 grade). If the amount of the phosphorous-containing flame retardant (b) is higher than the preferred range, the electrical properties, water absorption, and peeling strength of the electronic material prepared by using the resin composition is poor.

Furthermore, to ensure that the electronic material prepared by using the resin composition of the present invention has excellent electrical properties and physicochemical properties, the weight ratio of the resin system (a) to the phosphorous-containing flame retardant (b) is preferably from 95:5 to 75:30, such as 95:10, 95:15, 95:20, 95:25, 95:30, 90:5, 90:10, 90:15, 90:20, 90:25, 90:30, 85:5, 85:10, 85:15, 85:20, 85:25, 85:30, 80:5, 80:10, 80:15, 80:20, 80:25, 80:30, 75:5, 75:10, 75:15, 75:20, or 75:25. If the amount of the phosphorous-containing flame retardant (b) is too low such that the weight ratio of the resin system (a) to the phosphorous-containing flame retardant (b) exceeds the preferred range, the flame retardance of the prepared electronic material is poor. If the amount of the phosphorous-containing flame retardant (b) is too high such that the weight ratio of the resin system (a) to the phosphorous-containing flame retardant (b) exceeds the preferred range, the other physical property such as the peeling strength of the prepared electronic material is poor.

[Optional Components]

In the resin composition of the present invention, additives well-known to persons with ordinary skill in the art can be optionally used. For example, according to the species of the thermosetting resin constituent, additives such as free radical initiators, hardeners, and hardening promoters may be added into the resin system (a) to facilitate the curing reaction. Alternatively, additives such as fillers, dispersing agents, toughener, viscosity modifier, and flame retardants may be added into the resin composition to improve the physicochemical properties of the electronic material prepared by using the resin composition or the processability of the resin composition during the manufacturing process.

<Free Radical Initiator>

In the resin composition of the present invention, the resin system (a) can be directly cured by heat. However, in the case that the resin system (a) comprises a polyphenylene ether resin containing unsaturated group(s), it is preferred that a free radical initiator is added into the resin system (a) to facilitate the curing reaction. Examples of free radical initiators include but are not limited to azobisisobutyronitrile (AIBN), azobis(2-isopropyl)butyronitrile, 2,2'-azobis(2,4-dimethyl)valeronitrile (AVBN), benzoyl peroxide (BPO), acetyl isobutyryl peroxide, diacetyl peroxide, (2,4-dichlorobenzoyl) peroxide, (2-dimethylbenzoyl) peroxide, dodecanoyl peroxide, diisopropyl peroxydicarbonate, bis(3,5,5-trimethyl caproyl) peroxide, cyclohexanone peroxide, methylethyl ketone peroxide, dicyclohexylpropyl peroxydicarbonate, dicyclohexyl peroxydicarbonate, di(4-tert-butyl cyclohexyl) peroxydicarbonate, di(2-ethylhexyl) peroxydicarbonate, bis(2-phenyl ethoxy) peroxydicarbonate, bishexadecyl peroxydicarbonate, tert-butyl peroxybenzoate, tert-butyl peroxyphenylacetate, peracetic acid, tert-butyl peroxypivalate, tert-hexyl peroxypivalate, isopropylphenyl peroxyneodecanoate, tert-butyl hydroperoxide, isopropyl hydroperoxide, p-menthane hydroperoxide, diisopropyl peroxide, sec-tert-butyl peroxide, hydroperoxide, ammonium persulfate, potassium persulfate, alkyl metal peroxide, and oxy-alkyl metal.

Based on the dry weight of the resin composition, the amount of the free radical initiator is usually, but not limited to, 0.01 wt % to 2 wt %. The amount of the free radical initiator can be adjusted depending on the need of persons with ordinary skill in the art.

<Hardener and Hardening Promoter>

In the resin composition of the present invention, when the resin system (a) includes an epoxy resin, it is preferred that the resin system (a) further comprises a suitable hardener, such as a compound containing —OH group(s), a compound containing amino group, an anhydride compound, or an active ester compound, to promote the curing reaction. Examples of the hardener include but are limited to phenolic resins, styrene maleic anhydride (SMA), dicyanodiamide, di(anilino)sulfone, di(anilino)methane, aromatic diamine, aromatic dianhydride, aliphatic dianhydride, benzoxazine resins, cyanate resins, triazine phenolic resins, and styrene-vinyl phenol copolymers.

Based on the dry weight of the resin composition, the amount of the hardener is usually, but not limited to, 5 wt % to 25 wt %. The amount of the hardener can be adjusted depending on the need of persons with ordinary skill in the art.

Furthermore, to promote the ring-opening of epoxy functional groups and thus, the cross-linking reaction, it is preferred that the resin system (a) further comprises a suitable hardening promoter. The type of the hardening promoter is not particularly limited as long as the hardening promoter can promote the ring-opening of epoxy functional groups and lower the reacting temperature of the curing reaction. For example, the hardening promoter can be a tertiary amine, a quaternary ammonium, an imidazole compound, or a pyridine compound. In some embodiments of the present invention, the hardening promoter is selected from the group consisting of 2,3-diamino pyridine, 2,5-diamino pyridine, 2,6-diamino pyridine, 4-dimethylamino pyridine, 2-amino-3-methyl pyridine, 2-amino-4-methyl pyridine, 2-amino-3-nitro pyridine, and combinations thereof.

Based on the dry weight of the resin composition, the amount of the hardening promoter is usually, but not limited to, 0.5 wt % to 5 wt %. The amount of the hardening promoter can be adjusted depending on the need of persons with ordinary skill in the art.

<Filler>

Examples of filler include but are not limited to organic or inorganic fillers selected from the group consisting of silica, aluminum oxide, magnesium oxide, magnesium hydroxide, calcium carbonate, talc, clays, aluminum nitride, boron nitride, aluminum hydroxide, silicon aluminum carbide, silicon carbide, sodium carbonate, titanium dioxide, zinc oxide, zirconium oxide, quartzs, diamonds, diamond-like carbon, graphites, calcined kaolin, pryan, micas, hydrotalcite, hollow silica, polytetrafluroroethylene (PTFE) powders, glass beads, hollow glass beads, ceramic whiskers, carbon nanotubes, nanosized inorganic powders, and combinations thereof. In addition, to promote the dispersity of the filler in the resin composition, the filler can be optionally surface-treated. For example, the filler can be surface-treated by using a silane modifier, fluorosilane modifier, titanate coupling agent, or siloxane modifier, but the surface treatment is not limited thereto.

Based on the dry weight of the resin composition, the amount of the filler is usually, but not limited to, 0 wt % to 40 wt %. The amount of the filler can be adjusted depending on the need of persons with ordinary skill in the art.

Preparation of Resin Composition

The resin composition of the present invention may be prepared into varnish form for subsequent applications by evenly mixing the resin system (a) (including the thermosetting resin constituent and vinyl-containing elastomer), the phosphorous-containing flame retardant (b) and other optional components through a stirrer and dissolving or dispersing the obtained mixture into a solvent. The solvent here can be any inert solvent which can dissolve or disperse the components of the resin composition of the present invention, but does not react with them. Examples of the solvent which can dissolve or disperse the components of the resin composition include but are not limited to toluene, γ-butyrolactone, methyl ethyl ketone, cyclohexanone, butanone, acetone, xylene, methyl isobutyl ketone, N,N-dimethylformamide (DMF), N,N-dimethylacetamide (DMAc), and N-methyl-pyrolidone (NMP). The listed solvents can either be used alone or in combination. The amount of the solvent is not particularly limited as long as the components of the resin composition can be evenly dissolved or dispersed therein. In some embodiments of the present invention, a mixture of toluene, methyl ethyl ketone and γ-butyrolactone is used as the solvent.

Prepreg

The present invention also provides a prepreg prepared from the abovementioned resin composition, wherein the prepreg is obtained by immersing a substrate (a reinforcing material) into the abovementioned resin composition and drying the immersed substrate. Examples of reinforcing material include glass fiber cloths (e.g., glass-fiber woven fabrics or non-woven fabrics, glass papers, and glass mats), kraft papers, short fiber cotton papers, nature fiber cloths, organic fiber cloths (e.g., liquid crystal polymer), etc. In some embodiments of the present invention, 2116 glass fiber cloth are used as the reinforcing material, and the reinforcing material is heated and dried at 175° C. for 2 to 15 minutes (B-stage) to provide a semi-cured prepreg.

Metal-Clad Laminate and Printed Circuit Board

The present invention also provides a metal-clad laminate prepared from the abovementioned prepreg. The metal-clad laminate comprises a dielectric layer and a metal layer, wherein the dielectric layer is provided by the abovementioned prepreg. The metal-clad laminate may be prepared by the following process: (1) superimposing a plurality of prepregs and superimposing a metal foil (such as a copper foil) on at least one external surface of an dielectric layer composed of the superimposed prepregs to provide a superimposed object; and (2) performing a hot-pressing operation onto the superimposed object to obtain the metal-clad laminate. Alternatively, the metal-clad laminate may be prepared by directly coating the abovementioned resin composition onto a metal foil and drying it. Furthermore, a printed circuit board may be prepared by patterning the external metal foil of the metal-clad laminate.

The present invention will be further illustrated by the embodiments hereinafter, wherein the measuring instruments and methods are respectively as follows:

[Water Absorption Test]

The moisture resistance of the metal-clad laminate is tested by a pressure cooker test (PCT), i.e., subjecting the metal-clad laminate into a pressure container (121° C., saturated relative humidity (100% R.H.) and 1.2 atm) for 2 hours.

[Solder Resistance Test]

The solder resistance test is carried out by immersing the dried metal-clad laminate in a solder bath at 288° C. for a certain period and observing whether there is any defect such as delamination and blistering.

[Peeling Strength Test]

The peeling strength refers to the bonding strength between the metal foil and hot-pressed laminated prepreg, which is usually expressed by the force required for vertically peeling the clad copper foil with a width of ⅛ inch from the surface of the hot-pressed laminated prepreg.

[Glass Transition Temperature (Tg) Test]

The glass transition temperature (Tg) is measured by using a Differential Scanning Calorimeter (DSC), wherein the measuring methods are IPC-TM-650.2.4.25C and 24C testing method of the Institute for Interconnecting and Packaging Electronic Circuits (IPC).

[Flame Retardance Test]

The flame retardance test is carried out according to UL94V (Vertical Burn), which comprises the burning of a laminate, which is held vertically, using a Bunsen burner to compare its self-extinguishing properties and combustion-supporting properties. The ranking for the flame retardance levels is V1>V1>V2.

[Dielectric Constant (Dk) and Dissipation Factor (Df) Measurement]

Dk and Df are measured according to ASTM D150 under an operating frequency of 10 GHz. The resin content (RC) of the prepregs for test is about 53%.

EXAMPLES

<Preparation of Resin System (a)>
<Resins System I>

According to the ratio shown in Table 1, polyphenylene ether resin containing unsaturated group(s) (trade name: SA9000, available from Sabic Company), triallyl isocyanurate (TAIC, available from Evonik Company) as the isocyanurate containing vinyl or allyl group, bismaleimide resin of formula (IV) ($R_4$ is

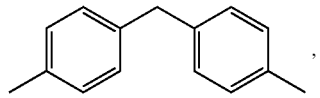

, trade name: BMI, available from K.I CHEMICAL Company), styrene butadiene copolymers (trade names: Ricon 100 and Ricon 181, both available from CARY VALLEY Company) as the vinyl-containing elastomer, and benzoyl peroxide (BPO, available from Fluka Company) as the free radical initiator were mixed under room temperature with a stirrer followed by adding toluene, methyl ethyl ketone and γ-butyrolactone (all available from Fluka Company) thereinto. After stirring the resultant mixture under room temperature for about 60 to 120 minutes, resin system I was obtained.

<Resins System II>

According to the ratio shown in Table 1, the polyphenylene ether derivative resin of formula (III) (trade name: PP807, available from Jin-Yi Company), polyphenylene ether resin containing unsaturated group(s) (trade name: OPE-2St, available from Mitsubishi Gas Chemical Company), vinyl-containing elastomer Ricon 100, isocyanurate containing vinyl or allyl group TAIC, bismaleimide resin BMI, and free radical initiator BPO were mixed under room temperature with a stirrer followed by adding toluene, methyl ethyl ketone and γ-butyrolactone thereinto. After stirring the resultant mixture under room temperature for about 60 to 120 minutes, resin system II was obtained.

<Resins System III>

The preparation procedures of resin system I were repeated to prepare resin system III, except that polyphenylene ether resin containing unsaturated group(s) OPE-2St was further added, and the amounts of polyphenylene ether resin containing unsaturated group(s) SA9000 and bismaleimide resin were adjusted as shown in Table 1.

<Resins System IV>

The preparation procedures of the resin system III were repeated to prepare resin system IV, except that vinyl-containing elastomer Ricon 181 and free radical initiator BPO were not used, bisphenol A type epoxy resin (trade name: BE-188EL, available from CCP Company) and methylenebis (2-ethyl-6-methylaniline) (MED, available from UNION CHEMICAL IND. CO., LTD) as the hardener were further added, and the amount of bismaleimide resin was adjusted as shown in Table 1.

<Resins System V>

According to the ratio shown in Table 1, polyphenylene ether resins containing unsaturated group(s) PP807 and OPE-2St, vinyl-containing elastomer Ricon 181, isocyanurate containing vinyl or allyl group TAIC, DCPD type epoxy resin (trade name: HP-7200H, available from DIC Company), and phenol (available from UNION CHEMICAL IND. CO., LTD) as the hardener were mixed under room temperature with a stirrer followed by adding toluene, methyl ethyl ketone and γ-butyrolactone thereinto. After stirring the resultant mixture under room temperature for about 60 to 120 minutes, resin system V was obtained.

<Resins System VI>

According to the ratio shown in Table 1, polyphenylene ether resins containing unsaturated group(s) PP807 and SA9000, vinyl-containing elastomer Ricon 100, and bismaleimide resin were mixed under room temperature with a stirrer followed by adding toluene, methyl ethyl ketone and γ-butyrolactone thereinto. After stirring the resultant mixture under room temperature for about 60 to 120 minutes, resin system VI was obtained.

To measure the Df values of the resin systems, electrometric samples were prepared using resin systems I to VI, respectively. Resin systems I to VI were coated on copper foils by a horizontal knife of a horizontal coater, respectively, and the coated copper foils were then placed in an oven and dried at 175° C. for 2 to 10 minutes to prepare resin coated copper foils in a semi-cured state. Next, a hot-pressing operation was performed on each of the resin coated copper foils (in a semi-cured state) with another sheet of copper foil (0.5 oz.). Herein, the hot-pressing conditions are as follows: raising the temperature to about 200° C. to 220° C. with a heating rate of 3.0° C./min, and hot-pressing for 180 minutes under the full pressure of 15 kg/cm² (initial pressure is 8 kg/cm²) at said temperature. Then, the Df values of resin systems I to VI were measured at 10 GHz. As shown in Table 1, the Df values of resin systems I to VI at 10 GHz are all lower than 0.008. The resin systems are suitable for use in high frequency applications.

<Preparation of Resin Composition>

Example 1

According to the ratio shown in Table 2, resin system I as the resin system (a), the phosphorous-containing flame retardant (b) of formula (I) (trade name: PQ-60, available from Jin-Yi Company, with a structure of the following formula (I-1)), and silica powders (available from Sibelco Company) as the filler were mixed under room temperature and stirred for 120 minutes to obtain a resin composition 1.

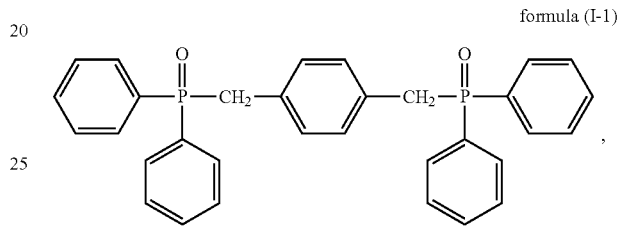

formula (I-1)

chemical formula for PQ-60

Example 2

The preparation procedures of Example 1 were repeated to prepare a resin composition 2, except that the phosphorous-containing flame retardant (b) of formula (II) (trade name: CG686, available from Chembridge International Corporation, with a structure of the following formula (II-1)) was further added, and the amount of the phosphorous-containing flame retardant (b) of formula (I) PQ-60 was adjusted as shown in Table 2.

TABLE 1

| | Composition of resin systems | | | | | | |
|---|---|---|---|---|---|---|---|
| | | Resin system | | | | | |
| Unit: parts by weight | | I | II | III | IV | V | VI |
| Polyphenylene ether resin containing unsaturated group(s) | PP807 | — | 30 | — | — | 30 | 40 |
| | SA9000 | 60 | — | 30 | 30 | — | 40 |
| | OPE-2St | — | 30 | 30 | 30 | 30 | — |
| Vinyl-containing elastomer | Ricon 100 | 10 | 15 | 10 | 10 | — | 5 |
| | Ricon 181 | 10 | — | 10 | — | 5 | — |
| Isocyanurate containing vinyl or allyl group | TAIC | 20 | 20 | 20 | 20 | 12 | — |
| Bismaleimide | BMI | 15 | 15 | 10 | 15 | — | 25 |
| Epoxy resin | HP-7200H | — | — | — | — | 12 | — |
| | BE-188EL | — | — | — | 30 | — | — |
| Hardener | Phenol | — | — | — | — | 6 | — |
| | MED | — | — | — | 12 | — | — |
| Free radical initiator | BPO | 0.3 | 0.3 | 0.3 | — | — | — |
| Df@10 GHz | | 0.0028 | 0.0030 | 0.0026 | 0.0070 | 0.0047 | 0.0068 |

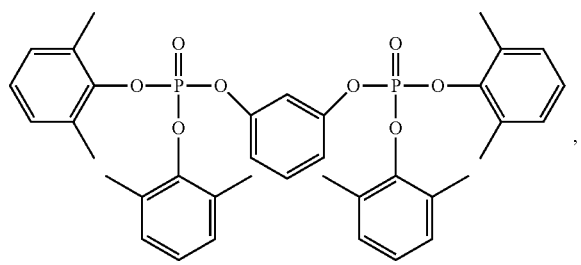

formula (II-1)

the chemical formula of CG686

Example 3

According to the ratio shown in Table 2, resin system II as the resin system (a), the phosphorous-containing flame retardant (b) of formula (II) CG686, and silica powders as the filler were mixed under room temperature and stirred for 120 minutes to obtain a resin composition 3.

Example 4

The preparation procedures of Example 3 were repeated to prepare a resin composition 4, except that the phosphorous-containing flame retardant (b) of formula (I) PQ-60 was further added, and the amount of the phosphorous-containing flame retardant (b) of formula (II) CG686 was adjusted as shown in Table 2.

Example 5

The preparation procedures of Example 2 were repeated to prepare a resin composition 5, except that resin system III was used as the resin system (a), and the amounts of the phosphorous-containing flame retardant (b) were adjusted as shown in Table 2.

Example 6

The preparation procedures of Example 5 were repeated to prepare a resin composition 6, except that the amounts of the phosphorous-containing flame retardant (b) were adjusted as shown in Table 2.

Example 7

The preparation procedures of Example 2 were repeated to prepare a resin composition 7, except that resin system IV was used as the resin system (a), and the amounts of the phosphorous-containing flame retardant (b) and the filler were adjusted as shown in Table 2.

Example 8

The preparation procedures of Example 2 were repeated to prepare a resin composition 8, except that resin system V was used as the resin system (a), and the amounts of the phosphorous-containing flame retardant (b) and the filler were adjusted as shown in Table 2.

Example 9

The preparation procedures of Example 1 were repeated to prepare a resin composition 9, except that resin system VI was used as the resin system (a), and the amounts of the phosphorous-containing flame retardant (b) and the filler were adjusted as shown in Table 2.

Example 10

The preparation procedures of Example 5 were repeated to prepare a resin composition 10, except that the amount of the phosphorous-containing flame retardant (b) was adjusted as shown in Table 2.

Comparative Example 1

According to the ratio shown in Table 2, resin system I as the resin system (a), phosphazene compound (structural formula:

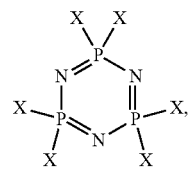

X is

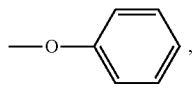

trade name: SPB100, available from Otsuka Chemical Company) as the flame retardant, and silica powders as the filler were mixed under room temperature and stirred for 120 minutes to obtain a comparative resin composition 1.

Comparative Example 2

The preparation procedures of Comparative Example 1 were repeated to prepare a comparative resin composition 2, except that resin system III was used as the resin system (a), and the amount of the flame retardant SPB100 was adjusted as shown in Table 2.

TABLE 2

| | | Composition of resin composition | | | | |
|---|---|---|---|---|---|---|
| | | Resin system (a) | Phosphorous-containing flame retardant (b) (parts by weight) | | SPB100 (parts by weight) | Silica powder (parts by weight) |
| | | | PQ-60 | CG686 | | |
| Example | 1 | I | 25 | — | — | 35 |
| | 2 | I | 15 | 15 | — | 35 |
| | 3 | II | — | 33 | — | 33 |
| | 4 | II | 17 | 12 | — | 33 |
| | 5 | III | 20 | 8 | — | 35 |
| | 6 | III | 7 | 24 | — | 35 |
| | 7 | IV | 22 | 7 | — | 43 |
| | 8 | V | 20 | 15 | — | 37 |
| | 9 | VI | 10 | — | — | 33 |
| | 10 | III | 35 | 10 | — | 35 |
| Comparative Example | 1 | I | — | — | 25 | 35 |
| | 2 | III | — | — | 26 | 35 |

[Preparation of Metal-Clad Laminate]

Metal-clad laminates 1 to 10 and comparative metal-clad laminates 1 and 2 were prepared by using resin compositions 1 to 10 and comparative resin compositions 1 and 2, respectively. First, glass fiber cloths (trade name: 2116, thickness: 0.08 mm) were respectively impregnated into resin compositions 1 to 10 and comparative resin compositions 1 and 2. The thickness of the glass fiber cloths was controlled to an appropriate extent. Next, the impregnated glass fiber cloths were placed in an oven and heated and dried at 175° C. for 2 to 15 minutes to produce prepregs in a semi-cured state (B-stage) (resin content: about 53%). Afterwards, four pieces of the prepregs were superimposed and two sheets of copper foil (0.5 oz.) were respectively superimposed on both of the two outer surfaces of the superimposed prepregs to provide a superimposed object. A hot-pressing operation was performed on each of the prepared objects to provide metal-clad laminates 1 to 10 (corresponding to resin compositions 1 to 10, respectively) and comparative metal-clad laminates 1 and 2 (corresponding to comparative resin compositions 1 and 2, respectively). Herein, the hot-pressing conditions are as follows: raising the temperature to about 200° C. to 220° C. with a heating rate of 3.0° C./min, and hot-pressing for 180 minutes under a full pressure of 15 kg/cm$^2$ (initial pressure is 8 kg/cm$^2$) at said temperature.

The water absorption, solder resistance, peeling strength, glass transition temperature (Tg), flame retardance, dissipation factor (Df), and dielectric constant (Dk) of metal-clad laminates 1 to 10 and comparative metal-clad laminates 1 and 2 were analyzed, and the results are tabulated in Table 3.

TABLE 3

Properties of metal-clad laminates

| | | Water absorption | Solder resistance | Peeling strength | Tg | Flame retardance | Df | Dk |
|---|---|---|---|---|---|---|---|---|
| | | | | Unit | | | | |
| | | % | minute | pound/inch | ° C. | UL grade | 10 GHz | 10 GHz |
| Metal-clad laminate | 1 | 0.36 | >10 | 3.3 | 226 | V0 | 3.82 | 0.0043 |
| | 2 | 0.35 | >10 | 3.7 | 208 | V0 | 3.82 | 0.0042 |
| | 3 | 0.37 | >10 | 4.1 | 197 | V0 | 3.83 | 0.0045 |
| | 4 | 0.36 | >10 | 3.7 | 209 | V0 | 3.83 | 0.0044 |
| | 5 | 0.34 | >10 | 3.8 | 212 | V0 | 3.81 | 0.0040 |
| | 6 | 0.35 | >10 | 4.3 | 198 | V0 | 3.82 | 0.0041 |
| | 7 | 0.47 | >10 | 3.7 | 209 | V0 | 3.98 | 0.0085 |
| | 8 | 0.45 | >10 | 4.0 | 197 | V0 | 3.92 | 0.0070 |
| | 9 | 0.39 | >10 | 3.5 | 230 | V0 | 3.87 | 0.0049 |
| | 10 | 0.45 | >10 | 3.0 | 208 | V0 | 3.85 | 0.0041 |
| Comparative metal-clad laminate | 1 | 0.43 | >10 | 2.8 | 189 | V0 | 3.87 | 0.0056 |
| | 2 | 0.45 | >10 | 2.9 | 187 | V0 | 3.85 | 0.0053 |

As shown in Table 3, the metal-clad laminates 1 to 10 manufactured by using the resin compositions of the present invention are provided with satisfactory physicochemical properties and electrical properties (such as water absorption, flame retardance, Dk, and Df) and outstanding heat resistance (Tg higher than 190° C. and excellent solder resistance). Thus, the resin composition of the present invention can be more extensively used. In particular, the metal-clad laminates prepared by using the resin composition of the present invention are provided with excellent peeling strength (3.0 pounds/inch or more), and Example 2 may have marvelous peeling strength (reach 3.7 pounds/inch) while having marvelous thermal resistance (Tg>200° C.). On the contrary, as shown in Comparative Examples 1 and 2, if a flame retardant rather than the particular flame retardant (b) of the present invention is used in the resin composition, the peeling strength and thermal resistance of the resultant metal-clad laminate will significantly decrease and result in peeling strength that is lower than 3.0 pounds/inch, and Tg less than 190° C., even though the flame retardance of the resultant metal-clad laminate can comply with V-0 level. Furthermore, as shown in Examples 1 to 9, in the case that the amount of the phosphorous-containing flame retardant (b) is within the designated preferable range, the peeling strength of the resultant metal-clad laminate is excellent and reaches 3.3 pounds/inch. It is surprising that as shown in Example 10, if the amount of the phosphorous-containing flame retardant (b) is further increased to exceed the designated preferable range, no further improvement is provided and the peeling strength is surprisingly lowered (only 3.0 pounds/inch).

The above examples are used to illustrate the principle and efficacy of the present invention and show the inventive features thereof. People skilled in this field may proceed with a variety of modifications and replacements based on the disclosures and suggestions of the invention as described without departing from the principle and spirit thereof. Therefore, the scope of protection of the present invention is that as defined in the claims as appended.

What is claimed is:

1. A resin composition, comprising:

(a) a resin system, which comprises a thermosetting resin constituent and a vinyl-containing elastomer and has a dissipation factor (Df) of not higher than 0.008 at 10 GHz after curing; and (b) a phosphorous-containing flame retardant, which is a combination of a compound of formula (I) and a compound of formula (II):

formula (I)

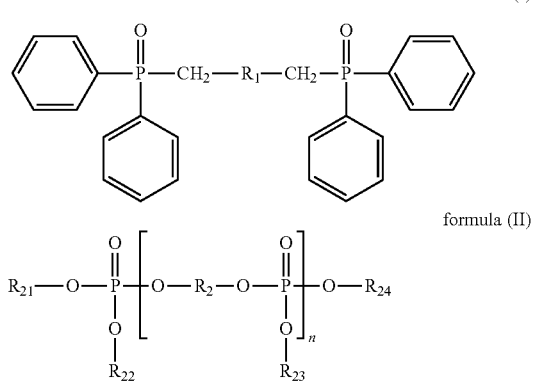

formula (II)

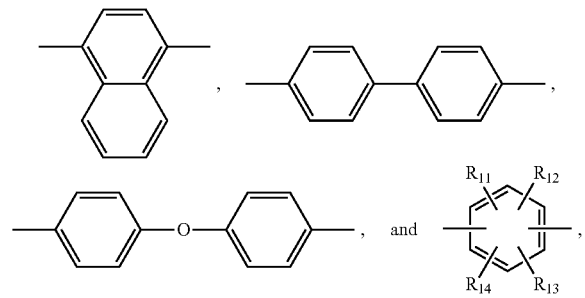

wherein,
R$_1$ is selected from the group consisting of a covalent bond, —CH$_2$—,

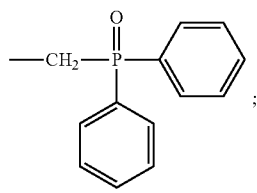, 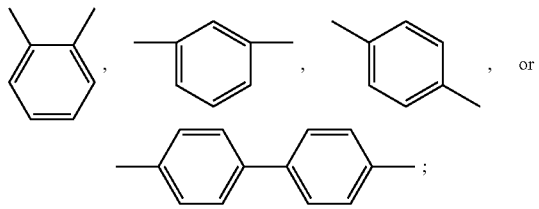

wherein R$_{11}$, R$_{12}$, R$_{13}$, and R$_{14}$ are independently H, alkyl, or

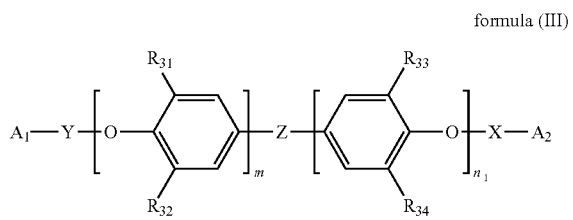

R$_2$ is

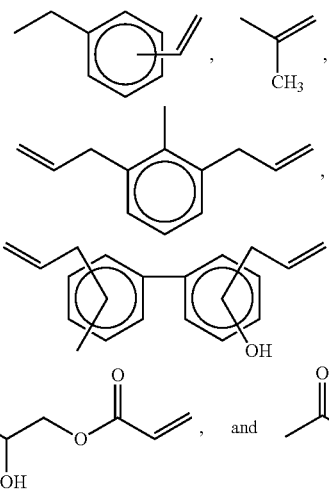;

R$_{21}$, R$_{22}$, R$_{23}$, and R$_{24}$ are independently an aryl or an alkylaryl; and
n is 1 or 2, and
wherein the amount of the phosphorous-containing flame retardant (b) is 2 wt % to 22 wt % based on the dry weight of the resin composition.

2. The resin composition of claim 1, wherein the thermosetting resin constituent comprises a thermosetting resin selected from the group consisting of polyphenylene ether resins containing unsaturated group(s), isocyanurates containing vinyl or allyl group, bismaleimide resins, epoxy resins, and combinations thereof.

3. The resin composition of claim 2, wherein the thermosetting resin constituent comprises a polyphenylene ether resin containing unsaturated group(s) selected from the group consisting of vinyl polyphenylene ether resins, allyl polyphenylene ether resins, acrylate polyphenylene ether resins, methacrylate polyphenylene ether resins, and combinations thereof.

4. The resin composition of claim 3, wherein the polyphenylene ether resin containing unsaturated group(s) has the structure of formula (III):

formula (III)

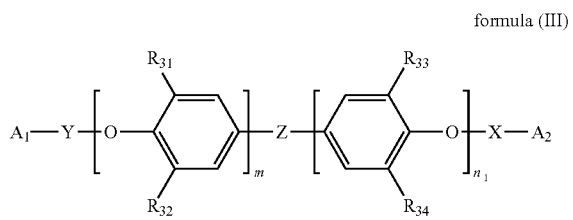

wherein,
R$_{31}$, R$_{32}$, R$_{33}$, R$_{34}$ are independently H or a substituted or unsubstituted C$_1$-C$_5$ alkyl;
m and n$_1$ are independently an integer ranging from 0 to 100, with the proviso that m and n$_1$ are not 0 at the same time;
A$_1$ and A$_2$ are independently selected from the group consisting of

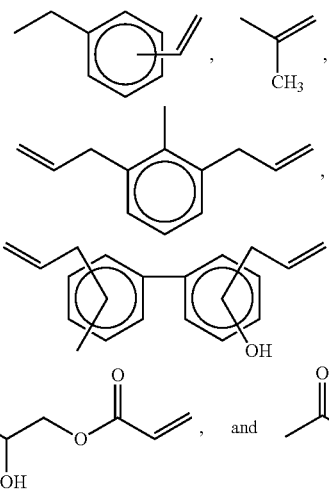

X and Y are independently a carbonyl group, an alkenyl-containing group or absent; and
Z is —O—,

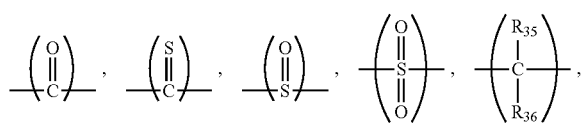

or absent, wherein $R_{35}$ and $R_{36}$ are independently H or a $C_1$-$C_{12}$ alkyl.

5. The resin composition of claim 3, wherein the resin system (a) further comprises a free radical initiator.

6. The resin composition of claim 2, wherein the thermosetting resin constituent comprises triallyl isocyanurate (TAIC), triallyl cyanurate (TAC), or a combination thereof.

7. The resin composition of claim 2, wherein the thermosetting resin constituent comprises a bismaleimide resin of formula (IV), a bismaleimide resin of formula (V), or a combination thereof:

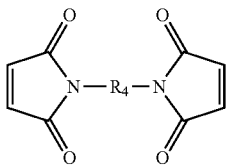

formula (IV)

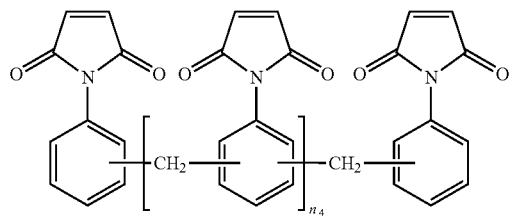

formula (V)

wherein, $R_4$ is an organic group; and $n_4$ is an integer ranging from 1 to 100.

8. The resin composition of claim 7, wherein $R_4$ is methylene (—CH$_2$—), 4,4'-diphenylmethane group

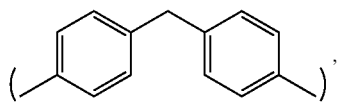

m-phenylene

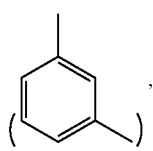

bisphenol A diphenyl ether group

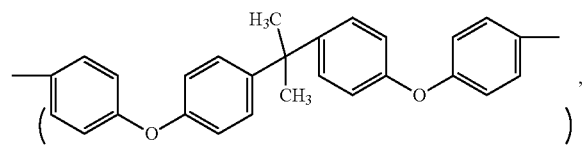

3,3'-dimethyl-5,5'-diethyl-4,4'-diphenylmethane group

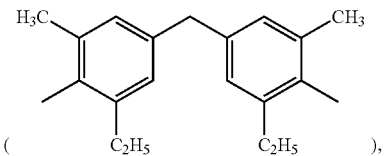

4-methyl-1,3-phenylene

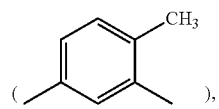

or 2,2,4-trimethyl-1,6-hexamethylene

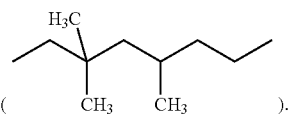

9. The resin composition of claim 2, wherein the thermosetting resin constituent comprises an epoxy resin selected from the group consisting of bifunctional epoxy resins, tetrafunctional epoxy resins, octofunctional epoxy resins, linear phenolic epoxy resins, and combinations thereof.

10. The resin composition of claim 9, wherein the resin system (a) further comprises a hardener, a hardening promoter, or a combination thereof.

11. The resin composition of claim 1, wherein the weight ratio of the resin system (a) to the phosphorous-containing flame retardant (b) is 95:5 to 75:30.

12. The resin composition of claim 1, wherein the vinyl-containing elastomer is selected from the group consisting of polybutadiene, styrene-butadiene copolymers (SBR), styrene-butadiene-styrene block copolymers (SBS), polyisoprene, styrene-isoprene copolymers, styrene-isoprene-styrene block copolymers (SIS), acrylonitrile-butadiene copolymers, acrylonitrile-butadiene-styrene block copolymers, and combinations thereof.

13. The resin composition of claim 1, wherein the amount of the vinyl-containing elastomer is 2 wt % to 20 wt % based on the dry weight of the resin composition.

14. The resin composition of claim 1, wherein the weight ratio of the compound of formula (I) to the compound of formula (II) is 1:2 to 2:1.

15. The resin composition of claim 1, further comprising a filler selected from the group consisting of silica, aluminum oxide, magnesium oxide, magnesium hydroxide, calcium carbonate, talc, clays, aluminum nitride, boron nitride, aluminum hydroxide, silicon aluminum carbide, silicon carbide, sodium carbonate, titanium dioxide, zinc oxide, zirconium oxide, quartzs, diamonds, diamond-like carbon, graphites, calcined kaolin, pryan, micas, hydrotalcite, hollow silica, polytetrafluroroethylene (PTFE) powders, glass beads, hollow glass beads, ceramic whiskers, carbon nanotubes, nanosized inorganic powders, and combinations thereof.

16. The resin composition of claim 1, further comprising a component selected from the group consisting of dispersing agents, toughener, viscosity modifiers, flame retardants, and combinations thereof.

17. A prepreg, which is prepared by immersing a substrate into the resin composition of claim 1 or is prepared by coating the resin composition of claim 1 onto a substrate and drying the coated substrate.

18. A metal-clad laminate, which is prepared from the prepreg of claim 17.

19. A printed circuit board, which is prepared from the metal-clad laminate of claim 18.

20. A metal-clad laminate, which is prepared by directly coating the resin composition of claim 1 onto a metal foil and drying the coated metal foil.

21. A printed circuit board, which is prepared from the metal-clad laminate of claim 20.

* * * * *